United States Patent
Borchers et al.

(10) Patent No.: US 7,210,078 B2
(45) Date of Patent: Apr. 24, 2007

(54) ERROR BIT METHOD AND CIRCUITRY FOR OSCILLATION-BASED CHARACTERIZATION

(75) Inventors: Brian D. Borchers, Wylie, TX (US); Stephen W. Spriggs, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 582 days.

(21) Appl. No.: 10/230,543

(22) Filed: Aug. 29, 2002

(65) Prior Publication Data

US 2004/0044934 A1 Mar. 4, 2004

(51) Int. Cl.
*G11C 29/00* (2006.01)
*G01R 31/28* (2006.01)
*G06F 11/00* (2006.01)

(52) U.S. Cl. .................. 714/718; 714/724; 714/37; 265/201

(58) Field of Classification Search ................ 714/724, 714/699, 799, 819, 718, 731
See application file for complete search history.

(56) References Cited

U.S. PATENT DOCUMENTS

| | | | | |
|---|---|---|---|---|
| 3,308,286 A | * | 3/1967 | Norman et al. | 340/146.2 |
| 3,614,777 A | * | 10/1971 | Foerster | 341/162 |
| 3,626,307 A | * | 12/1971 | Koyama | 377/49 |
| 3,909,606 A | * | 9/1975 | Shibata et al. | 714/699 |
| 4,439,849 A | * | 3/1984 | Nabeshima | 369/47.46 |
| 4,744,084 A | * | 5/1988 | Beck et al. | 714/33 |
| 5,329,532 A | * | 7/1994 | Ikeda et al. | 714/731 |
| 5,535,343 A | * | 7/1996 | Verseput | 375/359 |
| 6,266,749 B1 | * | 7/2001 | Hashimoto et al. | 711/167 |
| 6,279,090 B1 | * | 8/2001 | Manning | 711/167 |
| 6,388,533 B2 | * | 5/2002 | Swoboda | 331/57 |
| 6,496,424 B2 | * | 12/2002 | Ma et al. | 365/191 |
| 6,665,222 B2 | * | 12/2003 | Wright et al. | 365/203 |
| 6,857,089 B2 | * | 2/2005 | Schaber et al. | 714/724 |
| 2002/0154550 A1 | * | 10/2002 | Ma et al. | 365/191 |

* cited by examiner

*Primary Examiner*—Phung My Chung
(74) *Attorney, Agent, or Firm*—Rose Alyssa Keagy; W. James Brady; Frederick J. Telecky, Jr.

(57) ABSTRACT

A method for evaluating an output of a sequential circuit 2 by storing a series of output pulses from the sequential circuit 2 and determining whether the output pulses 4 toggled as desired. Also a circuit 1 for evaluating an output 4 of a sequential circuit 2 that determines if the output pulses 4 toggled as desired.

26 Claims, 1 Drawing Sheet

ERROR BIT METHOD AND CIRCUITRY FOR OSCILLATION-BASED CHARACTERIZATION

BACKGROUND OF THE INVENTION

This invention relates to the verification of the integrity of the output data during oscillation-based characterization.

DETAILED DESCRIPTION OF THE INVENTION

Figure 1:
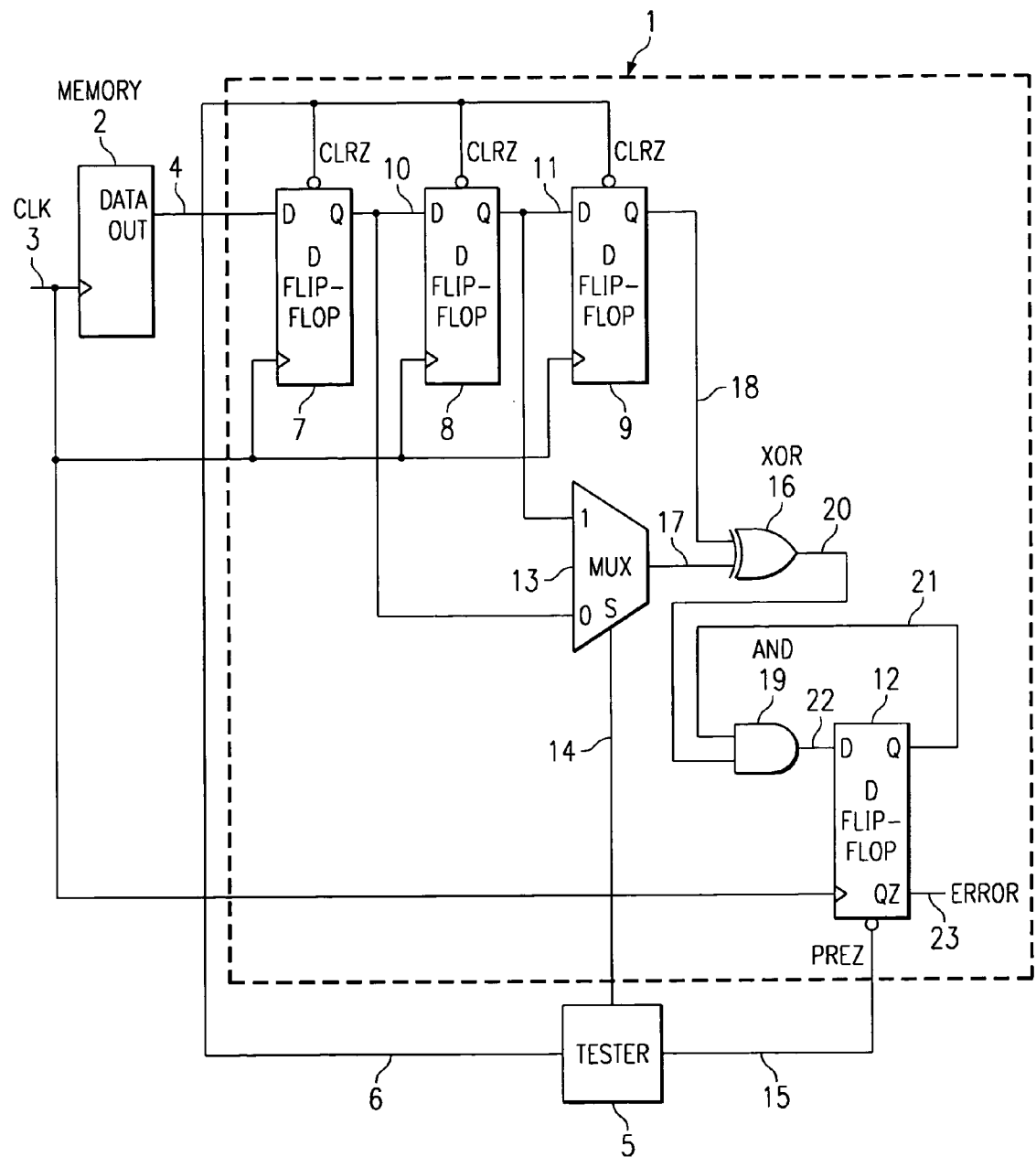
FIG. 1 shows the best mode error bit circuit.

Oscillation-based characterization needs to have sequential elements set up to switch states in an expected sequence that can be measured. Error bit circuitry can be used to verify that the data signal produced by the sequential element has integrity (i.e. bits are not being dropped). Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

Referring to FIG. 1, it depicts a best mode error bit circuit, 1, for testing the integrity of a sequential device 2. The sequential element used herein for describing the invention is a memory device. The memory 2 has a clock input 3 that prompts the memory to complete the next operation and send an output signal on data output 4.

Clock input 3 may be generated by the tester 5 or by the "ghost strobe" output of memory 2. The ghost strobe output will send a logic high pulse when the strobe cycle time is complete and another rising edge of a clock input can be applied. Thus the ghost strobe signal can be used as an input to the same memory 2 for near maximum operating frequency of memory 2.

In the best mode application memory 2 is preset to toggle the output 4 upon each input pulse on clock input 3. Examples of such preset operations that set the memory to create a toggling data output are described in U.S. Pat. Nos. 6,909,301, 6,799,134, and U.S. Pat. No. 6,734,743, incorporated herein by reference.

Before the testing of memory 2 begins, the tester 5 sends a signal on line 6 to clear the D flip-flops 7, 8, and 9. Flip-flops 7, 8 and 9 are configured as a scan chain. Namely, the output of flip-flop 7 is sent to the input of flip-flop 8 on line 10 (upon receiving a new clock pulse on line 3). Similarly, the output of flip-flop 8 is sent to the input of flip-flop 9 on line 11 (upon receiving a new clock pulse on line 3).

During test, the first clock pulse on line 3 sends the first output level online 4 to flip-flop 7. The second clock pulse on line 3 shifts the first output of memory 2 from flip-flop 7 to flip-flop 8 while the second output level on line 4 is sent to flip-flop 7. The third clock pulse on line 3 shifts the first output of memory 2 from flip-flop 8 to flip-flop 9, the second output of memory 2 from flip-flop 7 to flip flop 8, and sends the third output level on line 4 to flip-flop 7.

The error circuit 1 may be used to confirm the integrity of the data output 4 when the memory 2 is in either a mode where the output switches every clock (i.e. read-read mode, write-read or write-write on write-through memories) or a mode where the output switches every other clock (i.e. write-read on non-write through memories). The testing of "every cycle" mode will be described first. In "every-cycle" mode, the output signal 4 toggles after every clock pulse on line 3.

During "every-cycle" mode operation the tester 5 sends a logic level "1" signal on line 14 to multiplexer 13. The tester 5 also disables the error circuit 1 by holding D flip-flop 12 in a preset mode (by holding line 15 to a logic level "0") at least during the first three clock pulses on line 3. This action will prevent an unwarranted error flag from being produced on output line 23. During those first three clock pulses, the first three signal levels (i.e. 1, 0, 1) will be shifted into flip-flops 7, 8, and 9.

After the completion of the first three clock pulses (on line 3) the tester 5 enables flip-flop 12 by changing the signal on line 15 to a logic level "1". The next clock pulse on line 3 will send the new (here it's the fourth) signal on line 4 to flip-flop 7 while the signals from flip-flops 7 and 8 are being shifted into flip-flops 8 and 9 respectively. The output signals from flip-flops 7 and 8 are also sent to multiplexer 13. Multiplexer 13 passes the output signal from flip-flop 8 to XOR gate 16 on line 17. The output signal from flip-flop 9 is also sent to XOR gate 16 on line 18. XOR gate 16 compares the two signals, representing the signal levels of two consecutive output pulses from memory 2.

If the signals are at different levels, meaning the output on line 4 toggled upon consecutive clock pulses as desired, then XOR gate 16 sends a logic level "1" to AND gate 19. Because of the preset pulse on line 15, the initial output level on flip-flop 12 is also a logic level "1". This output becomes the second input on line 21 to AND gate 19. Since the input value on lines 20 and 21 are both "1" then AND gate 19 will send a level "1" on line 22 to D flip-flip 12. The result is that the error flag in line 23 is not activated.

If the signals are not at different levels, meaning that the output on line 4 did not toggle as desired, then XOR gate 16 sends a logic level "0" to AND gate 19. Now, AND gate 19 will send a level "0" on line 22 to D flip-flip 12; thereby activating the error flag on line 23. Once the error flag is triggered, it continues because of the continuous level "0" signal sent on line 21 from flip-flop 12 to AND gate 19.

In "alternate cycle" mode the memory 2 alternates between writing and reading with each cycle. Therefore, the data output signal on line 4 should change levels with every other clock pulse (i.e. 0, 0, 1, 1, 0, 0, 1, 1 . . . ).

The operation of the error bit circuit 1 in "alternate cycle" mode is similar to the above-described operation of the error bit circuit 1 in "every cycle" mode. As with error testing in "every cycle" mode, the tester 5 still disables the error circuit 1 by holding D flip-flop 12 in a preset mode (by holding line 15 to a logic level "0") at least during the first three clock pulses on line 3. This action will prevent an unwarranted error flag from being produced.

During "alternate cycle" mode the tester 5 sends a logic level "0" signal on line 14 to multiplexer 13. Now the multiplexer 13 passes the output of flip-flop 7 to XOR gate 16 to be compared to the output of flip-flop 9. If there are no errors in the data output 4 then the output of flip-flop 9 should be opposite the voltage level of the signal two clock cycles back (i.e. the output of flip-flop 7). The error flag on line 23 will now be triggered if the data output pulse on line 4 doesn't toggle with every other clock pulse.

Various modifications to the invention as described above are within the scope of the claimed invention. As an example, the test could be set up to write to and read from every address and data input; thus exercising every address and data input on the memory. Furthermore, the scan chain (flip-flops 7, 8, and 9) could be longer, even long enough to load the output of all addresses, creating a more extensive test of data integrity.

The above-described invention could also be incorporated into a BIST (Built-In Self Test) routine or incorporated within a device such as a memory. The logic functions described with gate logic could be accomplished with other logic arrangements or created in an ASIC. Moreover, the functions comprehended by the invention could be accomplished in various technologies such as CMOS or TTL While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for evaluating an output of a sequential circuit comprising:
    storing a series of output pulses from at least one output of said sequential circuit; and
    using error bit circuitry to determine whether said stored series of output pulses toggled with every clock pulse of said sequential circuit.

2. The method of claim 1 wherein an error signal is generated if said series of output pulses did not toggle with every said clock pulse of said sequential circuit.

3. The method of claim 1 wherein said sequential circuit is a memory circuit.

4. A method for evaluating an output of a sequential circuit comprising:
    storing a series of output pulses from at least one output of said sequential circuit; and
    using error bit circuitry to determine whether said stored series of output pulses toggled with every other clock pulse of said sequential circuit.

5. The method of claim 4 wherein an error signal is generated if said series of output pulses did not toggle with every other said clock pulse of said sequential circuit.

6. The method of claim 4 wherein said sequential circuit is a memory circuit.

7. A method for evaluating an output of a sequential circuit comprising:
    sending pre-set signals to one or more inputs of said sequential circuit to set said sequential circuit to toggle an output during operation in test mode; and
    operating said sequential circuit in test mode and analyzing said output to determine whether said data output toggled with each clock pulse during a selected period of said sequential circuit test mode operation.

8. The method of claim 7 wherein an error signal is generated if said data output did not toggle with each said clock pulse.

9. The method of claim 7 wherein said sequential circuit is a memory circuit.

10. A method for evaluating an output of a sequential circuit comprising:
    sending pre-set signals to one or more inputs of said sequential circuit to set said sequential circuit to toggle an output during operation in test mode; and
    operating said sequential circuit in test mode and analyzing said output to determine whether said data output toggled with every other clock pulse during a selected period of said sequential circuit test mode operation.

11. The method of claim 10 wherein an error signal is generated if said data output did not toggle with every other said clock pulse.

12. The method of claim 10 wherein said sequential circuit is a memory circuit.

13. A method for evaluating an output of a memory circuit comprising:
    sending pre-set signals to one or more inputs of said memory circuit to set a sequential circuit to toggle a data output upon each input clock pulse during operation in test mode;
    sending said data output to a series of flip-flops; and
    analyzing the outputs of said flip-flops to determine whether said data output toggled with each said input clock pulse during a selected period of said sequential circuit test mode operation.

14. The method of claim 13 wherein an error signal is generated if said data output did not toggle with each said input clock pulse.

15. A method for evaluating an output of a sequential circuit comprising:
    sending pre-set signals to one or more inputs of said sequential circuit to set the sequential circuit to toggle a data output upon each input clock pulse during operation in test mode;
    sending said data output to a series of flip-flops; and
    analyzing the outputs of said flip-flops to determine whether said data output toggled with every other said input clock pulse during a selected period of said sequential circuit test mode operation.

16. The method of claim 15 wherein an error signal is generated if said data output did not toggle with every other said input clock pulse.

17. A circuit for analyzing an output of a sequential circuit comprising:
    means for capturing a series of output pulses from said sequential circuit;
    means for comparing said captured output pulses; and
    means for sending an error signal if a logic level of a first of said series of output pulses matches a logic level of a second of said series of output pulses.

18. A circuit for analyzing an output of a sequential circuit comprising:
    means for capturing a series of output pulses from said sequential circuit;
    means for comparing said captured output pulses; and
    means for sending an error signal if a logic level of a first of said series of output pulses matches a logic level of a third of said series of output pulses.

19. A circuit for analyzing an output of a sequential circuit comprising:
    a first flip-flop coupled to an output of said sequential circuit;
    a second flip-flop coupled to said first flip-flop;
    a third flip-flop coupled to said second flip-flop;
    a multiplexer coupled to an output of said first and second flip-flop;
    a NOR gate coupled to said multiplexer and said third flip-flop;
    an AND gate coupled to said NOR gate; and
    a D flip-flop coupled to said AND gate and said output of said sequential circuit.

20. The circuit of claim 19 wherein said sequential circuit is a memory circuit.

21. A circuit for evaluating an output of a sequential circuit comprising:
   circuitry coupled to said sequential circuit for capturing a sequential series of output pulses from said sequential circuit; and
   circuitry coupled to said capture circuitry for analyzing whether a logic level of a first of said sequential series of output pulses matches a logic level of a third of said sequential series of output pulses.

22. The circuit of claim 21 further comprising error signal circuitry coupled to said analyzing circuitry wherein said error signal circuitry outputs a pulse when said logic level of a first of said sequential series of output pulses does not match said logic level of a third of said sequential series of output pulses.

23. The circuit of claim 21 wherein said sequential circuit is a memory circuit.

24. A circuit for evaluating an output of a sequential circuit comprising:
   circuitry coupled to said sequential circuit for capturing a sequential series of output pulses from said sequential circuit; and
   circuitry coupled to said capture circuitry for analyzing whether a logic level of a first of said sequential series of output pulses matches a logic level of a second of said sequential series of output pulses.

25. The circuit of claim 24 further comprising error signal circuitry coupled to said analyzing circuitry wherein said error signal circuitry outputs a pulse when said logic level of a first of said sequential series of output pulses does not match said logic level of a second of said sequential series of output pulses.

26. The circuit of claim 24 wherein said sequential circuit is a memory circuit.

* * * * *